(12) United States Patent
Yoo et al.

(10) Patent No.: US 6,232,837 B1
(45) Date of Patent: May 15, 2001

(54) OPTIMAL CONTROL METHOD FOR ADAPTIVE FEEDFORWARD LINEAR AMPLIFIER

(75) Inventors: Ki Suk Yoo; Sang Gee Kang; Jae Ick Choi; Jong Suk Chae, all of Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/417,651

(22) Filed: Oct. 14, 1999

(30) Foreign Application Priority Data

May 14, 1999 (KR) .................................................. 99-17299

(51) Int. Cl.$^7$ ....................................................... H03F 1/26
(52) U.S. Cl. ............................................ 330/151; 330/149
(58) Field of Search .................................. 330/149, 151; 332/127, 128; 375/296, 297

(56) References Cited

U.S. PATENT DOCUMENTS

| 4,885,551 | 12/1989 | Myer ........................................ 330/52 |
| 5,051,704 | 9/1991 | Chapman et al. ....................... 330/52 |
| 5,508,657 | 4/1996 | Behan ..................................... 330/151 |
| 5,877,653 | * 3/1999 | Kim et al. ............................... 330/149 |
| 5,952,895 | * 9/1999 | McCune et al. ....................... 332/128 |
| 5,959,500 | * 9/1999 | Garrido ................................. 330/151 |

OTHER PUBLICATIONS

Eid E. Eid and Fadhel M. Ghannouchi, "Adaptive Nulling Loop Control for 1.7–GH$_z$ Feedforward Linearization Systems," pp. 83–86.

James K. Cavers, "Adaptation Behavior of a Feedforward Amplifier Linearizer," IEE Transactions on Vehicular Technology, vol. 44, No. 1, Feb. 1995.

Prof. S. Kumar, PhD and G. Wells, "Memory Controlled Feedforward Lineariser Suitable for MMIC Implementation," IEE Proceedings–H, vol. 138, No. 1, Feb. 1991, pp. 9–12.

* cited by examiner

Primary Examiner—Steven J. Mottola
(74) Attorney, Agent, or Firm—Antonelli, Terry, Stout & Kraus, LLP

(57) ABSTRACT

Provided with an optimal control method for an adaptive feedforward linear amplifier that includes an adaptive controller connected to first and second PLLs (Phase Locked Loops) respectively determining frequency bands for a main signal component and a distortion signal component. The adaptive controller adaptively controls control voltages of a first variable phase shifter and a first variable attenuator constituting a main signal cancellation loop and control voltages of a second variable phase shifter and a second variable attenuator constituting an error signal cancellation loop. The optimal control method includes the steps of: (a) after initialization of necessary parameters, reading a strength of an input signal, determining the initial optimal control voltages of the first and second variable phase shifters and the first and second variable attenuators, outputting the corresponding control voltages, and setting the first PLL to read a main signal strength of the main signal cancellation loop; (b) controlling the optimal control voltages of the first variable phase shifter and the first variable attenuator until the main signal strength becomes lower than a first threshold, if the main signal strength exceeds the first threshold; (c) determining the main signal strength read out from the error signal cancellation loop, if the main signal strength is greater than the first threshold, repeat step (b), otherwise; and (d) controlling the optimal control voltages for the second variable phase shifter and the second variable attenuator until the difference between the main signal strength and the distortion signal strength becomes lower than a second threshold, if the difference is greater than the second threshold.

6 Claims, 3 Drawing Sheets

OPTIMAL CONTROL METHOD FOR ADAPTIVE FEEDFORWARD LINEAR AMPLIFIER

BACKGROUND OF THE INVENTION

1. Field of the Invention

The present invention relates generally to a feedforward linear amplifier for increasing linearity of a high power amplifier used in a radio communication system, and more particularly, to an optimal control method for an adaptive feedforward linear amplifier, whereby an adaptive controller can calculate an optimal control voltage by using an adaptive algorithm for the linear amplifier, providing for changes in environment.

2. Description of the Related Art

A feedforward linear amplifier includes two circuits and receives at least one carrier input signal at the predetermined range of frequency. The input signal is applied to the first circuit inclusive of a main power amplifier, in which case a distortion signal occurs. In the meantime, only the distortion signal component generated from the main power amplifier can be extracted by properly controlling variable attenuator and variable phase shifter in the first circuit. The distortion signal component thus extracted is transmitted to the second circuit. The second circuit amplifies the distortion signal component with an attenuation and phase shift such that the distortion signal component of the main power amplifier is removed from the final output terminal. In the present invention, emphasis is laid on the procedure of controlling the two variable attenuators and the variable phase shifter using the controller.

To read an output of the first circuit, the related art controller determines a desired frequency band, operates a voltage-controlled oscillator (VCO) at the frequency band and determines the position of a radio frequency (RF) switch. In order to minimize the signal component read out from the first circuit, a power detector detects the strength of the main signal component and after changing the phase shifter control voltage, the main signal strength is detected again. If the main signal strength is decreased, the phase shifter control voltage is changed in the opposite direction; and if the main signal strength is decreased, the phase shifter control voltage is changed in the same direction. Iterative procedures are performed N-M times for variations of the phase shifter and M times for the control of the variable attenuators. These procedures are iteratively performed for the phase shifter and the variable attenuator until the main signal strength is lower than a threshold. With the main signal strength lower than the predetermined level, then the second circuit is controlled. The procedures for the second circuit are analogous to those for the first feedback with an exception that the controller controls the distortion signal strength to be minimized.

There exist different methods to operate the controller appropriately, such as pilot signal method, vector modulator method, non-feedback loop method, loop method, trial-and-error method and a combination of them.

Among these methods, the trial-and-error method that is similar to the present invention requires more repetitions for calculating an optimal control voltage and the voltage value is controlled in the fixed step-size only. Therefore, different program steps are needed, resulting in retarded adaptation to changes in environment. It is further another disadvantage of the related art control method that the variation of the control voltage cannot be minimized sufficiently when the control voltage is close to the optimal value.

SUMMARY OF THE INVENTION

To solve the above problems with the related art, the present invention uses the existing LMS (Least Mean Square) method instead of the trial-and-error method, and a transversal filter structure as a fundamental structure for implementing the LMS method, thereby performing an adaptive algorithm continuously. The LMS method revised in the present invention is an algorithm that secures algorithm convergence.

It is, therefore, an object of the present invention to provide an optimal control method for a feedforward linear amplifier that enables an adaptive controller in the feedforward linear amplifier to rapidly calculate an optimal control voltage in an adaptive manner and stabilize the algorithm despite changes in environment.

To achieve the above object, there is provided an optimal control method for an adaptive feedforward linear amplifier that includes an adaptive controller connected to first and second PLLs (Phase Locked Loops) respectively determining frequency bands for a main signal component and a distortion signal component. The adaptive controller adaptively controls control voltages of a first variable phase shifter and a first variable attenuator constituting a main signal cancellation loop and control voltages of a second variable phase shifter and a second variable attenuator constituting an error signal cancellation loop. The optimal control method includes the steps of: (a) after initialization of necessary parameters, reading a strength of an input signal, determining the initial optimal control voltages of the first and second variable phase shifters and the first and second variable attenuators, outputting the corresponding control voltages, and setting the first PLL to read a main signal strength of the main signal cancellation loop; (b) controlling the optimal control voltages of the first variable phase shifter and the first variable attenuator until the main signal strength becomes lower than a first threshold, if the main signal strength exceeds the first threshold; (c) determining the main signal strength read out from the signal cancellation loop, if the main signal strength is greater than the first threshold, repeat step (b), otherwise; and (d) controlling the optimal control voltages for the second variable phase shifter and the second variable attenuator until the difference between the main signal strength and the distortion signal strength becomes lower than a second threshold, if the difference is greater than the second threshold.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described below with reference to the accompanying drawings. In the following description, well-known functions or constructions are not described in detail since they would obscure the invention in unnecessary detail.

Figure 1:
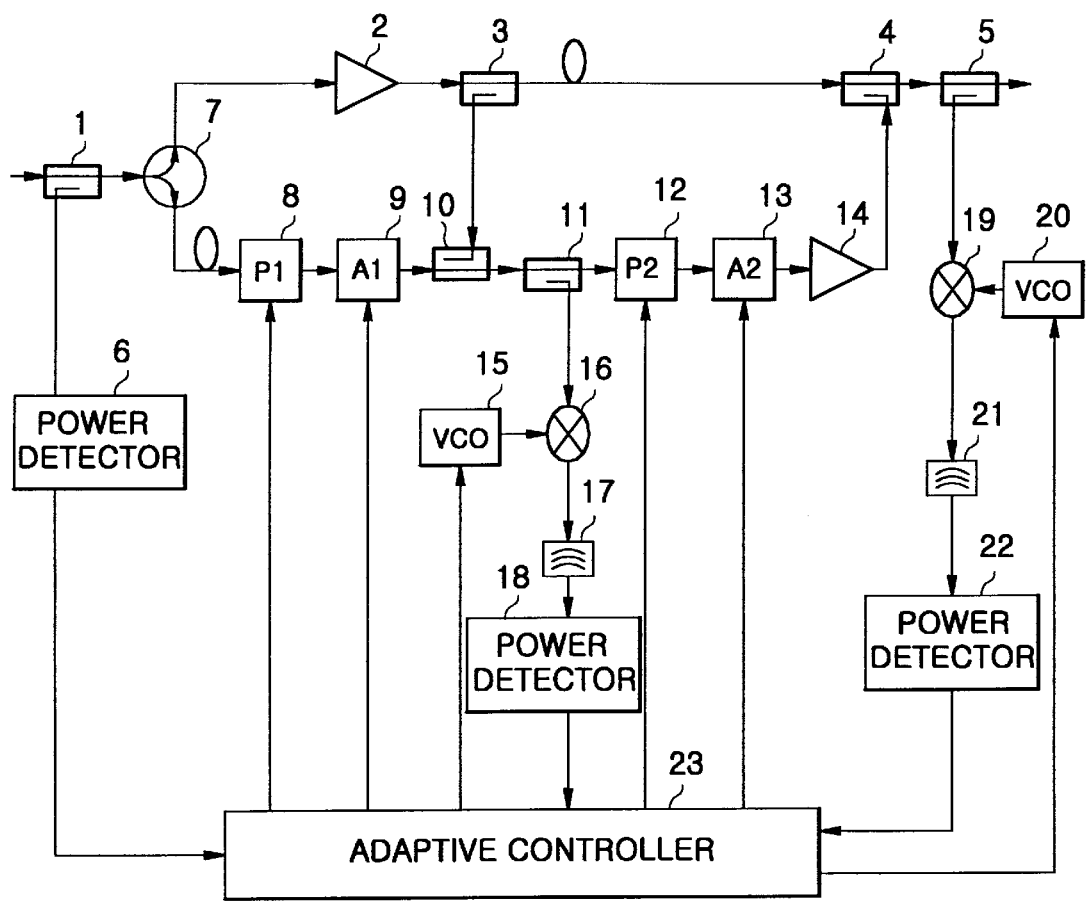
FIG. 1 is a schematic of a linear amplifier according to the present invention.

FIG. 1 is a schematic of an adaptive feedforward linear amplifier used in the present invention.

Referring to FIG. 1 the adaptive feedforward linear amplifier includes six couplers 1, 3, 4, 5, 10 and 11, a signal divider 7, two pairs of variable attenuator and variable phase shifter "A1–P1" and "A2–P2" 8–9 and 12–13, three power detectors 6, 18 and 22, two mixers 16 and 19, voltage-controlled oscillators (VCOs) 15 and 20, narrow band filters 17 and 21, a main amplifier 2, an error amplifier 14, and an adaptive controller 23.

Now, reference will be made in connection with FIG. 1 as to a description of the operation of the present invention.

A main signal input to the coupler 1 travels in two paths that are divided at a signal divider 7. The upper and lower signal paths constitute a main signal cancellation loop. As the main signal is amplified at the main amplifier 2, a distortion component occurs. The main signal in the lower path is appropriately delayed without a distortion component and passes through the coupler 10 via the variable phase shifter 8 and the variable attenuator 9. In the meantime, the variable phase shifter 8 and the variable attenuator 9 are properly controlled to leave the distortion component only at the output of coupler 10. Both the main signal component and the distortion component are transferred to a second loop (i.e., error signal cancellation loop) via the coupler 3, while only the distortion component is transferred to the second loop via the couplers 10 and 11. This distortion component has its phase and magnitude appropriately controlled by the variable phase shifter 12, the variable attenuator 13 and the error amplifier 14.

Here, the adaptive controller 23 determines a frequency band estimated to have the main signal component therein, by means of a PLL (Phase Locked Loop) including the VCO 15 and the mixer 16, and detects the main signal strength at the frequency band using the narrow band filter 17. The adaptive controller 23 then controls the variable phase shifter 8 and the variable attenuator 9 of the main signal cancellation loop such that the main signal strength is decreased at the given frequency band. In the meantime, the adaptive controller 23 determines a frequency band estimated to have the distortion signal component, by means of a PLL including the mixer 19 and the VCO 20 at the end of the linear power amplifier, and detects the distortion signal strength at the frequency band using the narrow band filter 21. The adaptive controller 23 then controls the variable phase shifter 12 and the variable attenuator 13 of the error signal cancellation loop such that the distortion signal strength is decreased at he frequency band.

Figure 2:
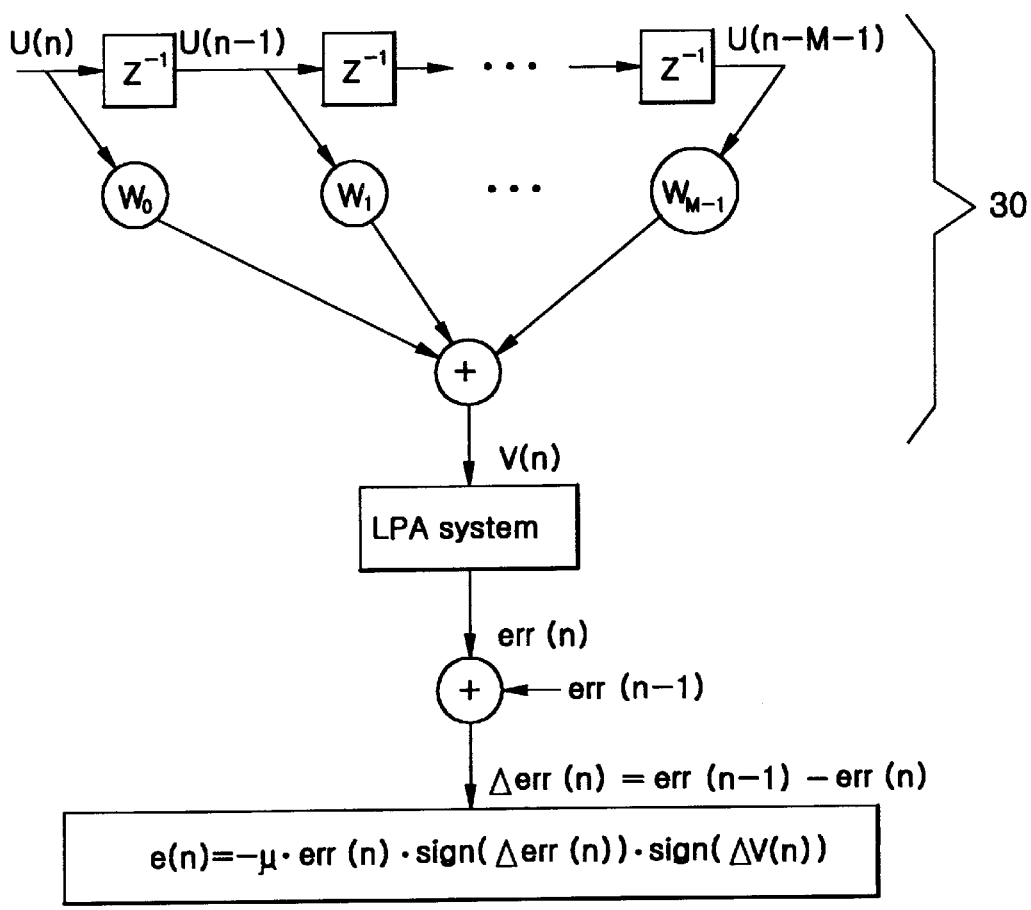
FIG. 2 is a diagram illustrating a procedure for varying a filter weight using a revised LMS algorithm in order to provide an optimal control voltage with a transversal filter structure.

FIG. 2 illustrates a procedure for varying a filter weight using a revised LMS algorithm in order to determine an optimal control voltage for a transversal filter structure.

Figure 3:
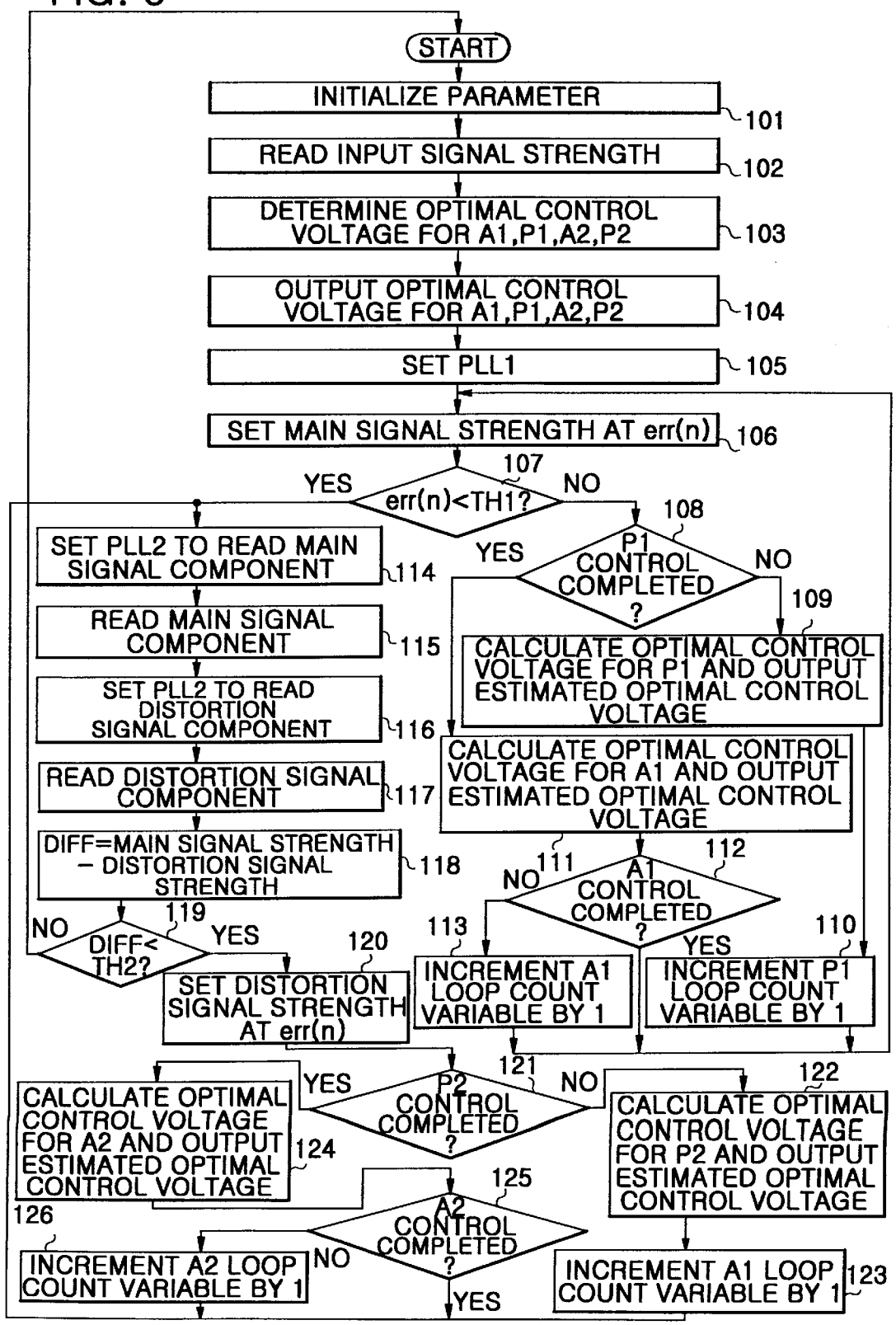
FIG. 3 is a flowchart illustrating the procedure to get e(n) used in a revised LMS algorithm according to the present invention.

In the linear power amplifier with the structure of FIG. 1, the adaptive controller 23 does not control both the pairs of variable attenuator and variable phase shifter "A1 and P1 and A2 and P2" at the same time but selectively controls either of them "A1 or P1 or A2 or P2", as illustrated in FIG. 3.

Referring to FIG. 2, the reference symbol u(n) represents an input signal strength detected at time n by the power detector 6. The preceding M values of u(n) are stored in a memory and multiplied by a weight indicated by "w" to calculate a current optimal control signal strength v(n) for the corresponding device. The value u(n) may be fixed as an input signal voltage detected at the initial stage. This structure is called filter structure and expressed by:

$$v(n)=\hat{w}^H(n)u(n) \qquad \text{Equation 1}$$

The optimal control signal strength v(n) for a selected device is input to an LPA system. The signal strength indicated by err(n) corresponds to a strength of the main signal component in the main signal cancellation loop when the selected device is A1 or P1, and a strength of the distortion signal component in the error signal cancellation loop when the selected device is A2 or P2. The current signal strength err(n) is compared to the previous signal strength err(n−1). A difference Δerr(n) between err(n) and err(n−1) is used to determine a value e(n) for changing a transversal filter weight w in the LMS algorithm. The reference symbol sign(·) represents a function for detecting a sign indicating whether the signal strength has a positive or negative value, and the reference symbol $\mu$ represents a parameter to control the rate of adaptation, affecting stability. The above procedure can be expressed by:

$$e(n)=-\mu\cdot\text{err}(n)\cdot\text{sign}(\Delta\text{err}(n))\cdot\text{sign}(\Delta V(n)) \qquad \text{Equation 2}$$

Here, whether the control voltage is increased or decreased is determined by "−sign (Δerr(n))·sign(ΔV(n))" and ΔV(n)= V(n−1)−V(n).

With the estimation error value e(n) determined, the LMS algorithm can be used to control the transversal filter weight such that the value e(n) is minimized. That is, the device can be controlled to minimize the main signal strength in the main signal cancellation loop or the distortion signal strength in the error signal cancellation loop, by minimizing the value err(n). The procedure of changing the transversal filter weight can be expressed by:

$$\hat{w}(n+1)=\hat{w}(n)+u(n)e(n) \qquad \text{Equation 3}$$

Here, the symbol "^" means an estimated value.

Now, reference will be made in connection with FIG. 3 as to a procedure of adaptively calculating an optimal control voltage at the adaptive controller of the present invention.

First, parameters required to perform a program are initialized (S101). The strength of an input signal is detected (S102) and an optimal control voltage for A1, P1, A2 and P2 is determined as a value most approximate to a given strength of the input signal (S103). The optimal control voltage is used as the initial control voltage and the initial value of u(n). Each of the optimal control voltages v(n) for the first and second attenuators A1 and A2 and the first and second phase shifters P1 and P2 is determined and then the corresponding voltage is generated (S104). The transversal filter weights are randomly selected.

The PLL 1 matches the frequency to determine a strength of the main signal component (S105) and the power detector 18 of FIG. 1 detects the strength err(n) of the main signal component (S106).

If the value err(n) is greater than a first threshold TH1 (S107), the first phase shifter P1 is controlled. If control of the first phase shifter P1 is not completed (S108), the first phase shifter P1 is iteratively controlled many times as many as a given loop count. When the loop count is not ended, the optimal control voltage for the first phase shifter P1 is calculated in the same manner as described in FIG. 2 and outputted (S109). Then, the variable corresponding to the P1 loop count is incremented by 1 (S110).

If control of the first phase shifter P1 is completed (S108), the first variable attenuator A1 is controlled. That is, the optimal control voltage for the first variable attenuator A1 is calculated in the same manner as described in FIG. 2 and the estimated optimal control voltage for A1 is outputted (S111). Thereafter, the first variable attenuator A1 is iteratively controlled until the A1 loop count is finished (S112–113). As described above, the first phase shifter P1 and the first variable attenuator A1 corresponding to the main signal cancellation loop are controlled iteratively until the value err(n) is lower than the first threshold TH1.

When control of the main signal cancellation loop is completed, that is, when the value err(n) is lower than the first threshold TH1, the error signal cancellation loop is controlled to set the PLL 2 for detection of the main signal component (S114) and measure the main signal strength (S115). Then, the PLL 2 is set for detection of the distortion signal component (S116) and the distortion signal strength is measured (S117). Thereafter, a difference between the two signal strengths (DIFF=main signal strength−distortion signal strength) is calculated (S118). If the difference is greater than a second threshold TH2, the procedure returns to step 105 (S119); and otherwise if the difference is less than the second threshold TH2, the distortion signal strength is set at the value err(n) (S120).

Since the variable phase shifter P2 is first controlled in the error signal cancellation loop in a similar way to the main signal cancellation loop, it is checked upon whether control of the second phase shifter P2 is completed (S121). If control of the second phase shifter P2 is not completed, the second phase shifter P2 is iteratively controlled many times as many as a given loop count. When the loop count is not ended, the optimal control voltage for the second phase shifter P2 is calculated in the same manner as described in FIG. 2 and the estimated optimal control voltage for P2 is outputted (S122). Then, the variable corresponding to the P2 loop count is incremented by 1 (S123).

If control of the second phase shifter P2 is completed, the second variable attenuator A2 is controlled. That is, the optimal control voltage for the second variable attenuator A2 is calculated in the same manner as described in FIG. 2 and the estimated optimal control voltage for A2 is outputted (S124). Thereafter, the second variable attenuator A2 is iteratively controlled until the A2 loop count is finished (S125–126). As described above, the second phase shifter P2 and the second variable attenuator A2 corresponding to the error signal cancellation loop are controlled iteratively until the value err(n) is lower than the second threshold TH2.

As described above, compared with the conventional trial-and-error method, the present invention can reduce the number of program steps and loops in determination of the optimal control value and provide small error values when the control value is dose to the optimal value, thereby minimizing the variation rate in a proportional way.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An optimal control method for an adaptive feedforward linear amplifier, which includes an adaptive controller connected to first and second PLLs (Phase Locked Loops) respectively determining frequency bands for a main signal component and a distortion signal component, wherein the adaptive controller adaptively controls control voltages of a first variable phase shifter and a first variable attenuator constituting a main signal cancellation loop and control voltages of a second variable phase shifter and a second variable attenuator constituting an error signal cancellation loop, the optimal control method comprising the steps of:

(a) after initialization of necessary parameters, reading a strength of an input signal, determining the initial optimal control voltages of the first and second variable phase shifters and the first and second variable attenuators, outputting the corresponding control voltages, and setting the first PLL to read a main signal strength of the main signal cancellation loop;

(b) controlling the optimal control voltages of the first variable phase shifter and the first variable attenuator until the main signal strength becomes lower than a first threshold, if the main signal strength exceeds the first threshold;

(c) determining a difference between the main signal strength and a distortion signal strength read out from the error signal cancellation loop, if the difference is greater than a second threshold; and (d) controlling the optimal control voltages for the second variable phase shifter and the second variable attenuator until the difference between the main signal strength and the distortion signal strength becomes lower than the second threshold, if the difference is greater than the second threshold.

2. The optimal control method as claimed in claim 1, wherein the step (b) comprises the steps of:

checking upon whether the control of the first variable phase shifter is completed;

calculating the optimal control voltage of the first variable phase shifter until a predetermined loop count and outputting an estimated optimal control voltage for the first variable phase shifter, if the control of the first variable phase shifter is not completed; and calculating the optimal control voltage of the first variable attenuator until the predetermined loop count and outputting an estimated optimal control voltage for the first attenuator, if the control of the first variable phase shifter is completed.

3. The optimal control method as claimed in claim 1, wherein in the step (c), the difference between the main signal strength and the distortion signal strength is obtained by setting the second phase locked loop to read out the main signal strength of the error signal cancellation loop, setting the second phase locked loop to read out the distortion signal strength, and subtracting the distortion signal strength from the main signal strength.

4. The optimal control method as claimed in claim 1, wherein the step (d) comprises the steps of:

setting a difference between the main signal strength and a distortion signal strength at the error signal err(n) when the difference is smaller than the second threshold;

checking upon whether the control of the second variable phase shifter is completed;

calculating the optimal control voltage of the second variable phase shifter until the predetermined loop count and outputting an estimated optimal control voltage for the second variable phase shifter, if the control of the second variable phase shifter is not completed; and calculating the optimal control voltage of the second variable attenuator until the predetermined loop count and outputting an estimated optimal control voltage for the second attenuator, if the control of the second variable phase shifter is completed.

5. The optimal control method as claimed in claim 4, wherein the respective optimal control voltages of the first and second variable phase shifters and the first and second variable attenuators are obtained by means of a transversal filter structure, wherein the optimal control voltages are obtained by multiplying the estimated optimal control voltages according to the input signal strength of a certain device selected out of the first and second variable phase shifters and the first and second variable attenuators by the controller by M preceding transversal filter weights stored in a memory, wherein the optimal control voltage is given by:

$$v(n) = \hat{w}^H(n)u(n)$$

wherein v(n) represents the optimal control voltage, $\hat{w}^H$ the preceding transversal filter weight and u(n) the estimated optimal control voltage where H denotes the transpose of a vector w.

6. The optimal control method as claimed in claim 5, wherein the transversal filter weight controlling step comprises the steps of:

after inputting the optimal control signal for the selected device to an LPA system, calculating a difference between the current signal strength and the previous signal strength, wherein the current signal strength is the main signal strength when the selected device is the first variable attenuator or the first variable phase shifter and the distortion signal strength when the selected device is the second variable attenuator or the second variable phase shifter, calculating a difference between the current control voltage and the previous control voltage, and determining the changing direction of the optimal control voltage by multiplying a sign of the difference between the current signal strength and the previous signal strength by a signal of the difference between the current control voltage and the previous control voltage;

multiplying the changing direction by an adaptive rate controlling parameter and the difference between the current signal strength and the previous signal strength, to determine an estimated error value given by:

$$e(n) = -\mu \cdot \text{err}(n) \cdot \text{sign}(\Delta \text{err}(n)) \cdot \text{sign}(\Delta V(n))$$

wherein e(n) represents the estimated error value, $\mu$ the adaptive rate controlling parameter, err(n) the signal strength, V(n) the control voltage, $\Delta$err(n) difference between the current signal strength and the previous signal strength, $\Delta$V(n) difference between the current control voltage and the previous control voltage, wherein the changing direction indicating whether the control voltage is increased or decreased is determined by "$-\text{sign}(\Delta\text{err}(n)) \cdot \text{sign}(\Delta V(n))$" and $\Delta V(n) = V(n-1) - V(n)$, wherein V(n-1) represents the previous control voltage; and controlling the transversal filter weight using an LMS (Least Mean Square) algorithm so as to minimize the estimated error value, wherein the transversal filter weight is determined by:

$$\hat{w}(n+1) = \hat{w}(n) + u(n)e(n)$$

wherein "^" means an estimated value.

* * * * *